US009380724B2

(12) United States Patent
Ikuta

(10) Patent No.: US 9,380,724 B2
(45) Date of Patent: Jun. 28, 2016

(54) WIRELESS COMMUNICATION MODULE, LED LIGHTING DEVICE, SOLAR PHOTOVOLTAIC SYSTEM, SELF-START SYSTEM AND DETECTION DEVICE

(71) Applicant: ROHM CO., LTD., Kyoto (JP)

(72) Inventor: Tomohiro Ikuta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 378 days.

(21) Appl. No.: 13/850,777

(22) Filed: Mar. 26, 2013

(65) Prior Publication Data

US 2013/0271925 A1 Oct. 17, 2013

(30) Foreign Application Priority Data

Mar. 27, 2012 (JP) ................................ 2012-070974
Mar. 13, 2013 (JP) ................................ 2013-049891

(51) Int. Cl.
*H05K 1/14* (2006.01)
*H05K 7/02* (2006.01)

(52) U.S. Cl.
CPC ................ *H05K 7/026* (2013.01); *H05K 1/144* (2013.01); *H05K 1/148* (2013.01); *H05K 2201/042* (2013.01); *H05K 2201/10106* (2013.01); *H05K 2201/10143* (2013.01); *H05K 2201/10371* (2013.01)

(58) Field of Classification Search
CPC ........................ H05K 1/144; H05K 2201/042
USPC ................................................ 361/735, 790
See application file for complete search history.

(56) References Cited

U.S. PATENT DOCUMENTS 5,666,272 A * 9/1997 Moore .................... B81B 7/007 257/678

FOREIGN PATENT DOCUMENTS

JP 2002-353841 12/2002
WO WO 2010105530 A1 * 9/2010 .......... H02J 13/0003

* cited by examiner

*Primary Examiner* — Ramon M Barrera

(74) *Attorney, Agent, or Firm* — Hamre, Schumann, Mueller & Larson, P.C.

(57) ABSTRACT

A wireless communication module includes: a wireless circuit configured to transmit/receive a wireless signal; a first inter-board connector; a first board on which the wireless circuit and the first connector are mounted; a signal processing circuit configured to process the wireless signal transmitted/received by the wireless circuit; a second inter-board connector configured to be connected to the first connector; and a second board on which the signal processing circuit and the second connector are mounted. The first board overlaps at least partially with the second board under a condition where the first connector and the second connector are interconnected.

14 Claims, 21 Drawing Sheets

WIRELESS COMMUNICATION MODULE, LED LIGHTING DEVICE, SOLAR PHOTOVOLTAIC SYSTEM, SELF-START SYSTEM AND DETECTION DEVICE

CROSS-REFERENCE TO RELATED APPLICATION(S)

This application is based upon and claims the benefit of priority from Japanese Patent Application Nos. 2012-70974, filed on Mar. 27, 2012, and 2013-49891, filed on Mar. 13, 2013, the entire contents of which are incorporated herein by reference.

TECHNICAL FIELD

The present disclosure relates to a wireless communication module, an LED lighting device, a solar photovoltaic system, a self-start system and a detection device.

BACKGROUND

In recent years, wireless communication units have been modularized. For example, Bluetooth modular devices with high productivity have been proposed, which provide compatibility irrespective of internal and external antenna specifications of an apparatus configuring a system.

In the related art, it is required that a set maker should connect a wireless communication module to a microcomputer to process an output from the wireless communication module. However, since the wireless communication module and the microcomputer are required to be interconnected by a number of signal lines, the set maker may have an increased burden of circuit design.

It is therefore contemplated that a wireless communication circuit (or RF (Radio Frequency) circuit) and a microcomputer is integrated and mounted on a single board. However, such a wireless communication module may result in an increase in board area and module size due to parallel arrangement of the RF circuit and the microcomputer. In addition, the board on which the RF circuit is mounted is required to be a multi-layered board made of a high-k material since the RF circuit operates with a high frequency. Accordingly, when the RF circuit and the microcomputer are mounted on the single board, the multi-layered board made of a high-k material is compelled to be unnecessarily used for the microcomputer, which may result in increased costs.

SUMMARY

The present disclosure provides some embodiments of a wireless communication module, an LED lighting device, a solar photovoltaic system, a self-start system and a detection device which are capable of achieving compactness while integrating an RF circuit with a microcomputer and realizing reduction in production costs.

According to one embodiment of the present disclosure, there is provided a wireless communication module including: a wireless circuit configured to transmit/receive a wireless signal; a first inter-board connector; a first board on which the wireless circuit and the first connector are mounted; a signal processing circuit configured to process the wireless signal transmitted/received by the wireless circuit; a second inter-board connector configured to be connected to the first connector; and a second board on which the signal processing circuit and the second connector are mounted, wherein the first board overlaps at least partially with the second board under a condition where the first connector and the second connector are interconnected.

According to another embodiment of the present disclosure, there is provided an LED lighting device including the above-described wireless communication module.

According to another embodiment of the present disclosure, there is provided a solar photovoltaic system including the above-described wireless communication module.

According to another embodiment of the present disclosure, there is provided a self-start system including: the above-described wireless communication module configured to receive an external signal; and an operation part configured to perform a predetermined ON/OFF switching function based on the received external signal of the wireless communication module.

According to another embodiment of the present disclosure, there is provided a detection device including: a sensor configured to detect a predetermined state; and the above-described wireless communication module configured to transmit a detection signal of the sensor in a wireless manner.

DETAILED DESCRIPTION

Figure 1A:
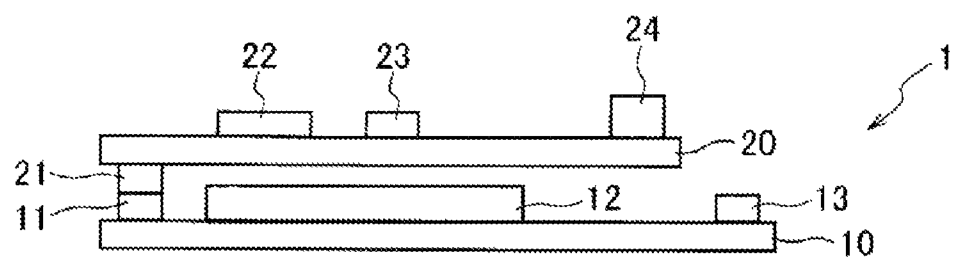
FIGS. 1A to 1C are schematic configuration views showing an example configuration of a wireless communication module according to a first embodiment, FIG. 1A being a schematic side view, FIG. 1B being a schematic plan view and FIG. 1C being another schematic plan view.

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Embodiments of the present disclosure will now be described in detail with reference to the drawings. Throughout the drawings, the same or similar elements are denoted by the same or similar reference numerals. It is however noted that the drawings are just schematics, and relationships between thickness and planar dimension of elements, thickness ratios of various layers and so on may be unrealistic. Accordingly, detailed thickness and dimensions should be determined in consideration of the following description. In addition, it is to be understood that the figures include different dimensional relationships and ratios.

The following embodiments are provided to illustrate devices and methods to embody the technical ideas of the present disclosure and are not limited to materials, forms, structures, arrangements and so on of elements detailed herein. The embodiments of the present disclosure may be modified in different ways without departing from the spirit and scope of the invention defined in the claims.

First Embodiment

A first embodiment will now be described with reference to FIGS. 1A to 5.

A wireless communication module 1 according to the first embodiment includes an RF circuit 12 for transmitting/receiving wireless signals, an inter-board connector 11, an RF board 10 mounted thereon with the RF circuit 12 and the connector 11, a microcomputer 22 for processing the wireless signals transmitted/received by the RF circuit 12, an inter-board connector 21 which can be connected to the connector 11, and a control board 20 mounted thereon with the microcomputer 22 and the connector 21 and is configured such that the RF board 10 and the control board 20 are at least partially overlapped with each other when the connector 11 and the connector 21 are interconnected.

In addition, the RF board 10 and the control board 20 may be arranged such that a board side of the RF board 10 on which the RF circuit 12 is mounted faces a board side of the control board 20 on which the microcomputer 22 is not mounted.

In addition, an antenna 13 may be arranged in a region on the RF board 10 in which the RF board 10 and the control board 20 do not overlap with each other.

In addition, the RF board 10 may be a multi-layered board made of a material having a higher dielectric constant than the control board 20.

(Wireless Communication Module)

Figure 1B:
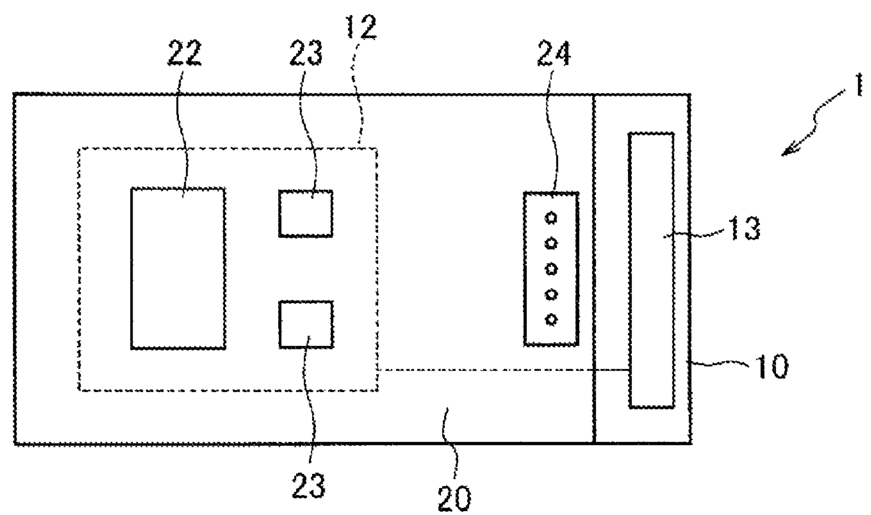
Figure 1C:
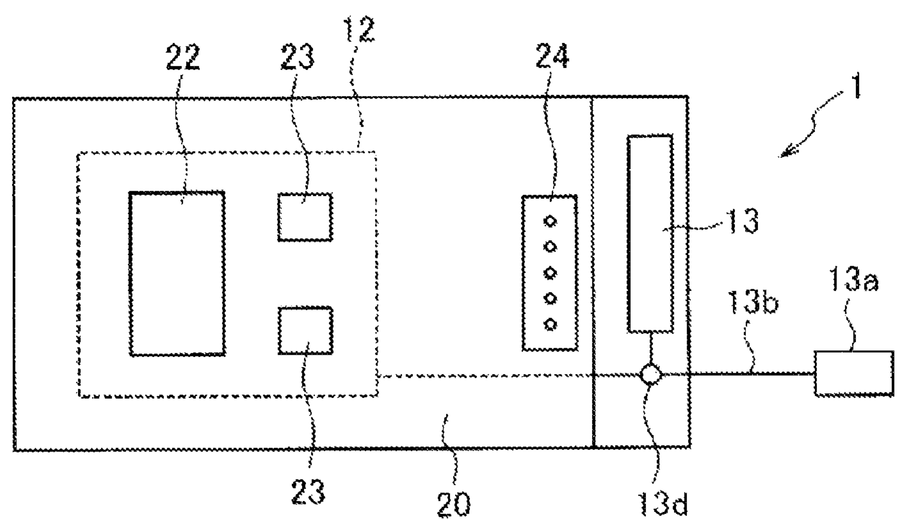

FIGS. 1A to 1C are schematic configuration views showing an example configuration of the wireless communication module 1 according to the first embodiment, FIG. 1A being a schematic side view and FIG. 1B being a schematic plan view. As shown in these figures, the wireless communication module 1 includes two boards, i.e., the RF board 10 and the control board 20, which are connected in a three dimensional manner by the connectors 11 and 21. In the following description, board sides in which the two boards 10 and 20 face with each other are called "inner board sides" and opposite board sides are called "outer board sides."

The RF circuit 12 and the connector 11 are mounted on the inner board side of the RF board 10. The RF circuit 12 is a wireless circuit for transmitting/receiving wireless signals and operates with a high frequency. The connector 11 is a thin inter-board connector which is commonly called a "board-to-board connector."

The connector 21 is mounted on the inner board side of the control board 20. The connector 21 is a thin inter-board connector which can be connected to the connector 11. In addition, the microcomputer 22, other electronic part 23 and a connector 24 are mounted on the outer board side of the control board 20. The microcomputer 22 is a signal processing unit for processing the wireless signals transmitted/received by the RF circuit 12. The connector 24 is used to provide external connection.

When the connector 11 is connected to the connector 21, the RF board 10 faces the control board 20. The RF circuit 12 is interposed between the two boards 10 and 20, and the microcomputer 22 and the other electronic part 23 are arranged on the outer board side of the control board 20. As shown in these figures, the RF board 10 is larger in size than the control board 20 and has a projecting right end when viewed from the plane view of FIGS. 1B and 1C. When the antenna 13 is disposed on the projecting right end of the RF board 10, deteriorated sensitivity of the antenna 13 can be avoided since electromagnetic waves can be prevented from being interrupted by metal parts or the like.

FIG. 1C is a schematic plan view showing one example of a connection between the antenna 13 and the RF circuit 12. As shown in this figure, the antenna 13 and an external antenna 13*a*, which will be described in detail later, are connected to the RF circuit 12 via a switch 13*d*. The switch 13*d* includes a first connection portion connected to the external antenna 13*a* and a second connection portion connected to the antenna 13. If the antenna 13 is used to transmit/receive the wireless signals, the switch 13*d* is fixed with the antenna 13 connected to the second connection portion. On the other hand, if the external antenna 13a is used to transmit/receive the wireless signals, the switch 13d is fixed with a cable 13b of the external antenna 13a connected to the first connection portion. Other configurations are the same as those in FIG. 1B.

(RF Circuit)

Figure 2:
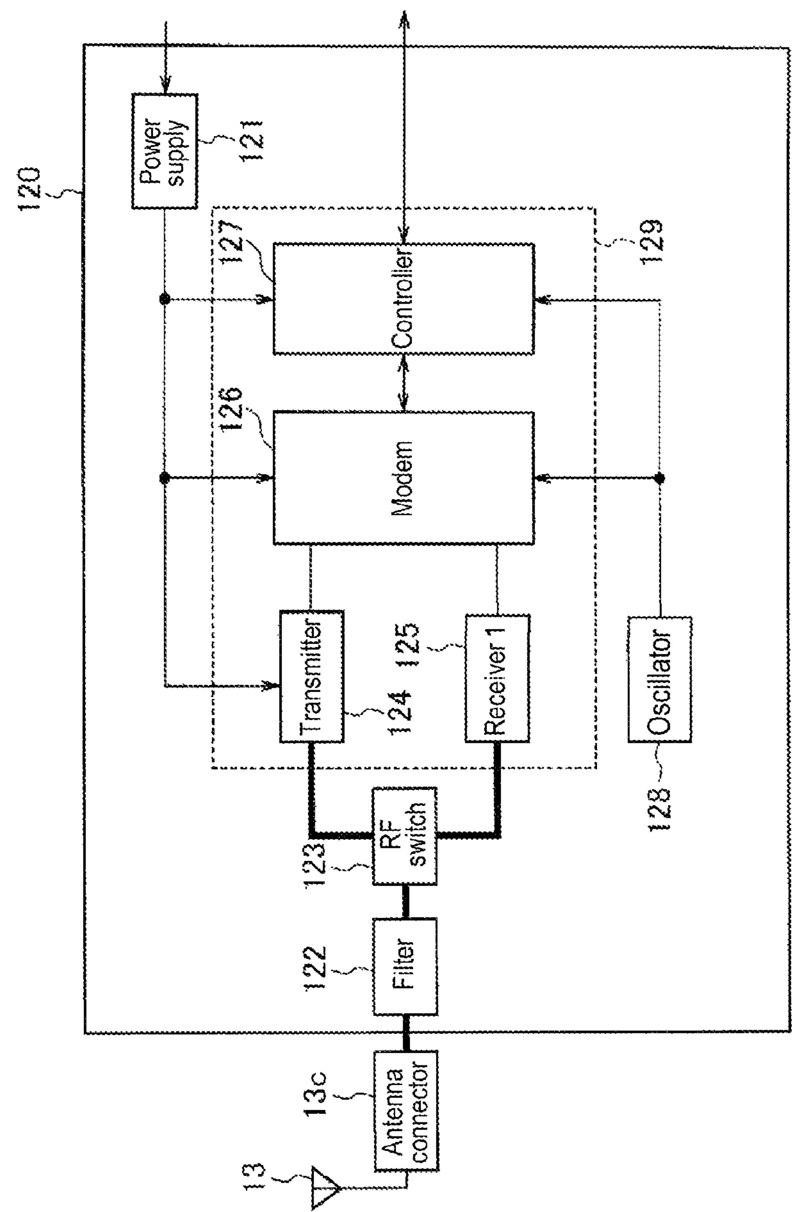
FIG. 2 is a schematic block diagram showing an example configuration of an RF circuit according to the first embodiment.

FIG. 2 is a block diagram showing an example configuration of the RF circuit 12 according to the first embodiment. The RF circuit 12 includes a power supply 121, a filter 122, an RF switch 123, a transmitter 124, a receiver 125, a modem 126, a controller 127 and a signal generator 128. These components 121 to 128 are covered by a metal shield plate 120 including a flat top portion and four side portions. The shield plate 120 has an internal cavity. The side portions can be fixed to the RF board 10 while covering the RF circuit 12. The side portions may be soldered to a pad connected to a ground of the RF board 10. That is, the shield plate 120 is fixed to the RF board 10 while making electrical connection to the ground of the RF board 10. In addition, the shield plate 120 may be made of, for example, resin, instead of metal. In this case, the shield plate 120 is fixed to the RF board 10 by means of, for example, an adhesive. The transmitter 124, the receiver 125, the modem 126 and the controller 127 in the RF circuit 12 constitute a single RFIC unit 129. The power supply 121 converts direct current of a voltage into direct current of a different voltage, which is then supplied to the modem 126, the controller 127 and so on. The signal generator 128 generates a clock signal to be supplied to the modem 126, the controller 127 and so on. The controller 127 performs various controls for wireless communication. The modem 126 performs frequency modulation based on a modulation scheme such as GFSK (Gaussian Frequency-Shift Keying) or the like. The RF switch 123 is used to switch between transmission and reception of the wireless signals. The filter 122 for reducing noises is connected to the antenna 13 via an antenna connector 13c.

(RF Board and Control Board)

Figure 3A:
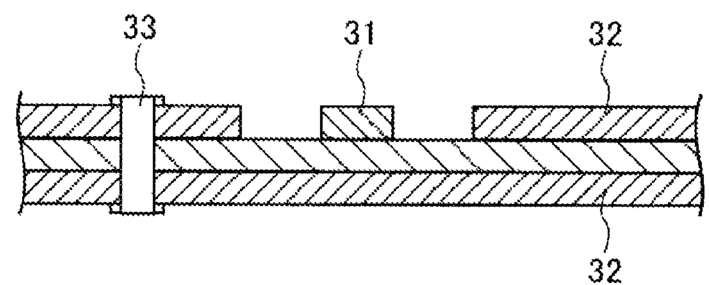
FIGS. 3A and 3B are views illustrating an RF board according to the first embodiment, FIG. 3A being a schematic sectional view and FIG. 3B being a schematic plan view.
Figure 3B:
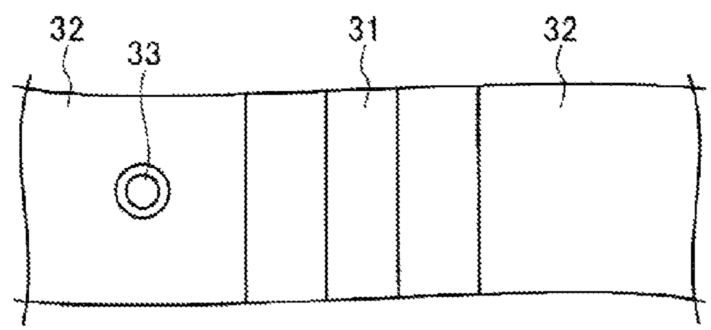

FIGS. 3A and 3B are views illustrating the RF board 10 according to the first embodiment, FIG. 3A being a schematic sectional view and FIG. 3B being a schematic plan view. The RF board 10 is required to use a multi-layered board made of a high-k material since the RF circuit 12 operates with a high frequency. The RF board 10 may be a multi-layered board of, for example, four to six layers. As shown in these figures, the RF board 10 includes a strip line 31. The strip line 31 corresponds to a line between the connector 13c and the RF switch 123, a line between the RF switch 123 and the transmitter 124, and a line between the RF switch 123 and the receiver 125, as indicated by thick lines in FIG. 2. In FIGS. 3A and 3B, reference numerals 32 and 33 denote a ground pattern and a via hole, respectively. The RF board 10 is made of a high-k material such as glass epoxy, alumina, SiN, SiF or the like. The control board 20 need not be a multi-layered board made of a high-k material but may be a single layer board made of, for example, glass epoxy.

(Applications)

Figure 4:
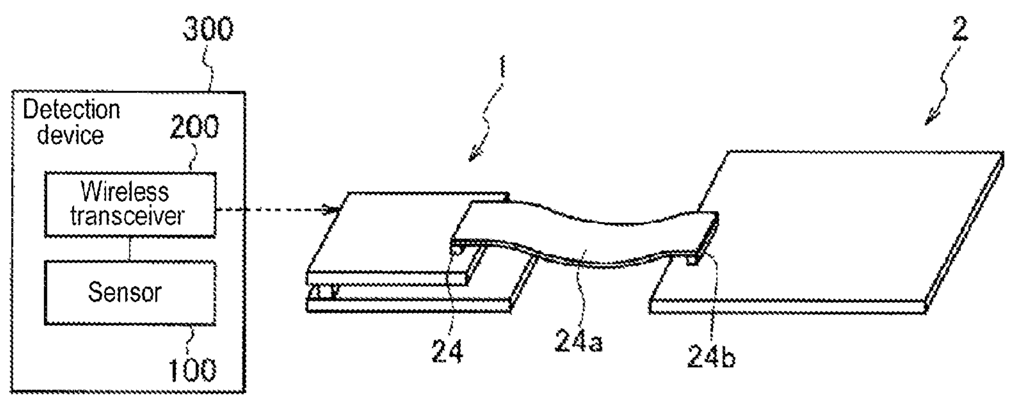
FIG. 4 is a schematic view showing an external appearance of an application of the wireless communication module of the first embodiment to an LED lighting device.

FIG. 4 is a schematic view showing an external appearance of an application of the wireless communication module 1 of the first embodiment to an LED lighting device. The connector 24 of the wireless communication module 1 is connected to a connector 24b of an LED power module 2 via a harness 24a. This LED lighting device allows a user to perform an operation such as lighting-ON/OFF from another room by exchanging a wireless signal with a remote controller. In addition, as shown in FIG. 4, if a detection device 300 including a sensor 100 for detecting the presence of a person (or a certain condition) and a wireless transmitter 200 for transmitting a detection signal by wireless are combined with the LED lighting device, then this constitutes a system which automatically switches between lighting ON and OFF depending on whether or not the presence of a person is detected by the sensor 100. In this case, the wireless transmitter 200 for transmitting the detection signal of the sensor 100 in a wireless manner can be configured with the wireless communication module 1 according to this embodiment.

Figure 5:
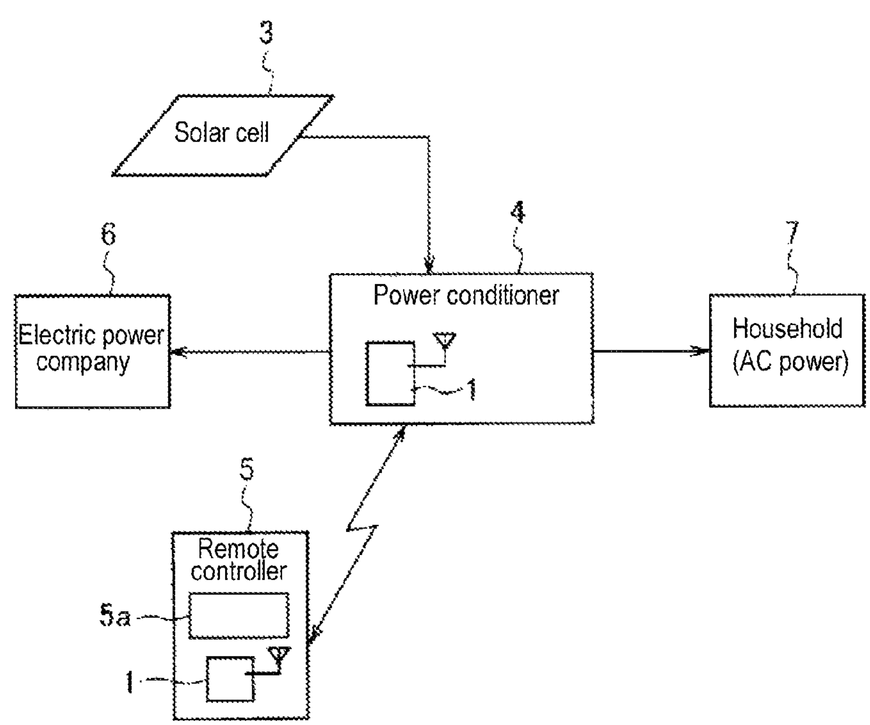
FIG. 5 is a schematic block diagram showing an application of the wireless communication module of the first embodiment to a solar photovoltaic system.

FIG. 5 is a schematic block diagram showing an application of the wireless communication module 1 of the first embodiment to a solar photovoltaic system. A power conditioner 4 converts electricity generated by a solar cell 3 into AC electric power available for households 7. In addition, surplus electric power may be sold to an electric power company 6. The wireless communication modules 1 are mounted on the power conditioner 4 and its remote controller 5, respectively. This allows a wireless signal to be exchanged between the power conditioner 4 and the remote controller 5, thereby allowing the display of various kinds of data such as quantity of generated electricity, power consumption and the like on a monitor 5a of the remote controller 5.

Without being limited to the above examples of application, the wireless communication module 1 may be applied to an automatic operation system (or self-start system) having an ON/OFF switching function based on a signal from a sensor or a signal from a manipulation by a user (e.g., a remote controller manipulation). In other words, this automatic operation system is a system including the wireless communication module 1 to receive an external signal and an operation part to perform a predetermined ON/OFF switching function based on the received external signal of the wireless communication module 1. For example, this automatic operation system employing the wireless communication module 1 is suitable to be applied to automatic door opening/closing, escalator running/stopping, lighting ON/OFF, alarm ON/OFF, automatic faucet, automatic cleaning and so on based on detection of existence of a person. In addition, as described above, the wireless communication module 1 may be used as a transmitter. In addition, a detection object of the sensor 100 may be a physical quantity such as temperature, pressure and the like without being limited to the existence of living things including people.

As described above, the wireless communication module 1 according to the first embodiment is configured such that the RF board 10 and the control board 20 overlap with each other with the connector 11 and the connector 21 interconnected. This allows parts to be mounted in a three dimensional manner, thereby providing a decreased size while integrating the RF circuit 12 with the microcomputer 22. In addition, the control board 20 can be made of an inexpensive material, thereby achieving reduction in costs. In addition, the RF board 10 and the control board 20 are separated from each other, thereby allowing each user to customize only the microcomputer 22 and hence to strengthen or modify the functions of the wireless communication module 1.

In addition, in this embodiment, the RF board 10 and the control board 20 are arranged such that the board side on which the RF circuit 12 is mounted faces the board side on which the microcomputer 22 is not mounted. That is, since only parts of the RF board 10 are arranged between the RF board 10 and the control board 20, it is possible to provide a thin wireless communication module 1.

Second Embodiment

A configuration of a wireless communication module 1 according to a second embodiment will be now described with reference to FIGS. 6A and 6B, with an emphasis placed on differences from that of the first embodiment.

(Wireless Communication Module)

Figure 6A:
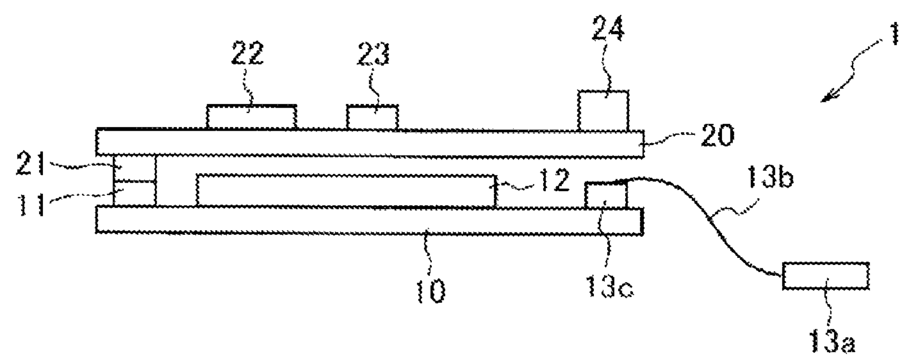
FIGS. 6A and 6B are schematic configuration views showing an example configuration of a wireless communication module according to a second embodiment, FIG. 6A being a schematic side view and FIG. 6B being a schematic plan view.
Figure 6B:
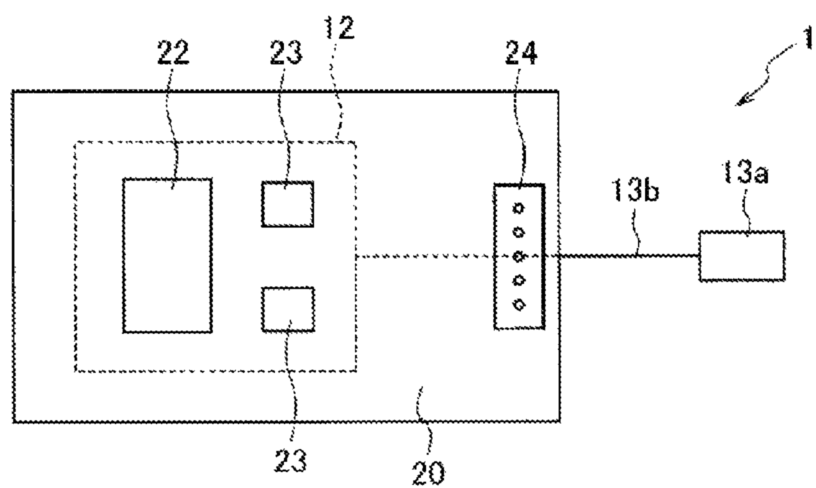

FIGS. 6A and 6B are schematic configuration views showing an example configuration of the wireless communication module 1 according to the second embodiment, FIG. 6A being a schematic side view and FIG. 6B being a schematic plan view. The second embodiment has the same configuration as the first embodiment except that the antenna 13*a* is externally attached. Specifically, the antenna connector 13*c* is mounted on the inner board side of the RF board 10 and the antenna 13*a* is connected to the antenna connector 13*c* via the cable 13*b*. In this case, the RF board 10 may have substantially the same size as the control board 20, as shown in FIGS. 6A and 6B.

As described above, the wireless communication module 1 according to the second embodiment allows the antenna 13*a* to be externally attached, thereby making it possible to further reduce the size of the RF board 10 over that in the first embodiment.

Third Embodiment

A configuration of a wireless communication module 1 according to a third embodiment will be now described with reference to FIGS. 7A to 8B, with an emphasis placed on differences from those of the first and second embodiments.

(Wireless Communication Module)

Figure 7A:
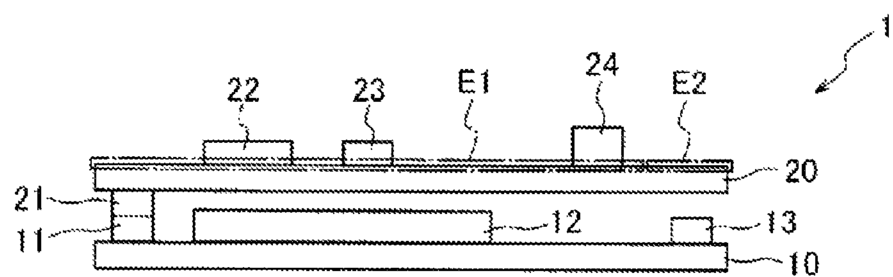
FIGS. 7A and 7B are schematic configuration views showing an example configuration of a wireless communication module according to a third embodiment, FIG. 7A being a schematic side view and FIG. 7B being a schematic plan view.
Figure 7B:
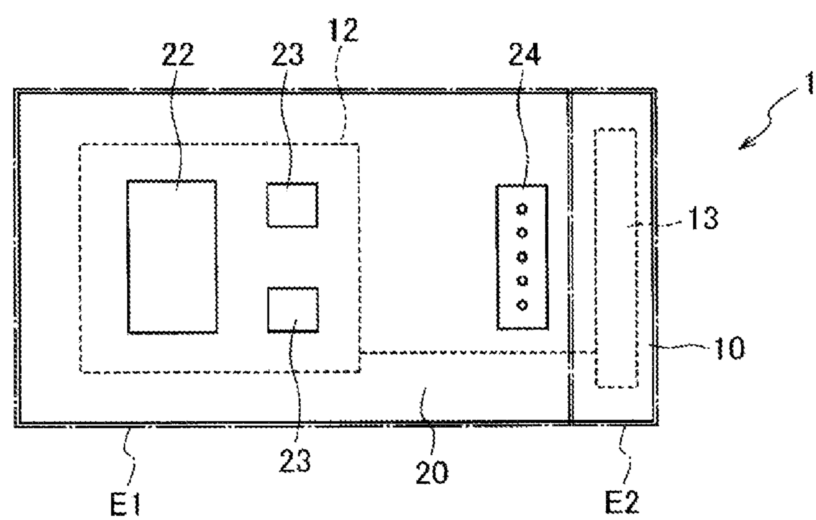

FIGS. 7A and 7B are schematic configuration views showing an example configuration of the wireless communication module 1 according to the third embodiment, FIG. 7A being a schematic side view and FIG. 7B being a schematic plan view. The third embodiment has the same configuration as the first embodiment except that the antenna 13 is sandwiched between the RF board 10 and the control board 20. In other words, the antenna 13 may be interposed between the RF circuit 12 and the control board 20 as long as metal parts and the like are not placed near the antenna 13.

Specifically, the antenna 13 is disposed in a region on the RF board 10 in which the RF board 10 and the control board 20 overlap with each other, and the microcomputer 22 is disposed outside a near-region E2 of the antenna 13. As used herein, the term "near-region E2 of the antenna 13" refers to a region which is likely to have an effect on a radio wave state of the antenna 13. More specifically, the antenna 13 and the microcomputer 22 are arranged in a non-overlapping manner when viewed from a direction in which the RF board 10 and the control board 20 overlap with each other (for example, a point of view of FIG. 7B). However, it is to be understood that the microcomputer 22 is not limited to the exact position in FIGS. 7A and 7B as long as it can be positioned within a region E1 which is not near the antenna 13. In addition to the microcomputer 22, the connector 24 for external connection, the other electronic part 23, and the wiring pattern on the control board 20 are positioned to avoid the region E2.

Figure 8A:
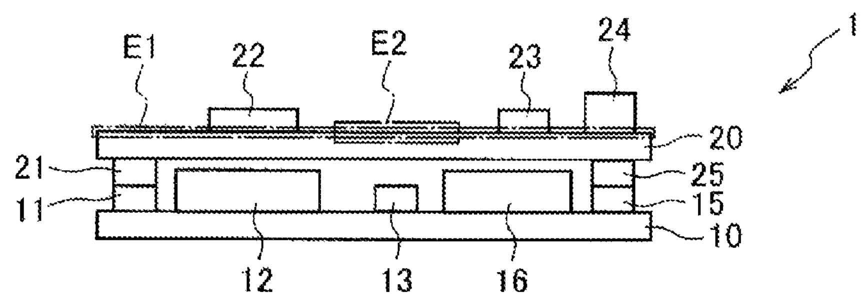
FIGS. 8A and 8B are schematic configuration views showing an example configuration of another wireless communication module according to the third embodiment, FIG. 8A being a schematic side view and FIG. 8B being a schematic plan view.
Figure 8B:
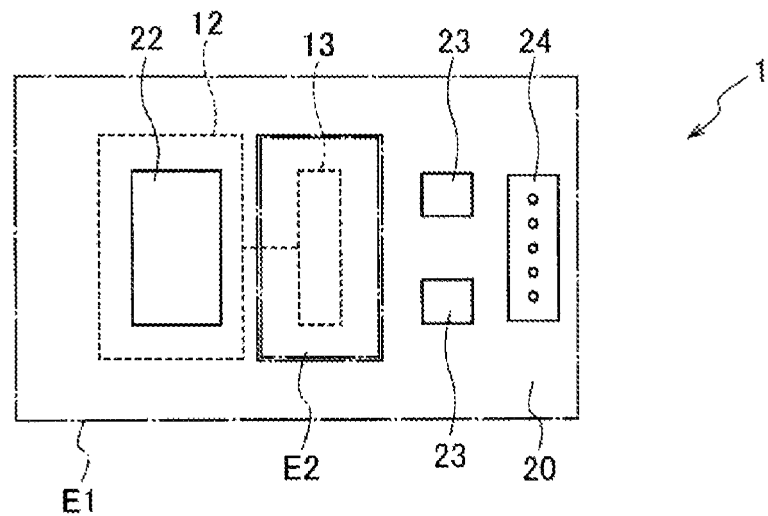

FIGS. 8A and 8B are schematic configuration views showing an example configuration of another wireless communication module 1 according to the third embodiment, FIG. 8A being a schematic side view and FIG. 8B being a schematic plan view. The wireless communication module 1 shown in FIGS. 8A and 8B is similar to that shown in FIGS. 7A and 7B in that the antenna 13 is interposed between the RF board 10 and the control board 20 but is different from that shown in FIGS. 7A and 7B in that the antenna 13 is disposed in the central portion of the RF board 10 instead of being disposed in the right end of the RF board 10. In this case, the connector 24, the microcomputer 22, the other electronic part 23 and so on are arranged to avoid the near-region E2 of the antenna 13 as well.

As described above, the wireless communication module 1 according to the third embodiment is configured such that the antenna 13 is interposed between the RF board 10 and the control board 20. Also in this case, since various parts and wiring patterns on the control board 20 are arranged to avoid the near-region E2 of the antenna 13, it is possible to avoid deteriorated sensitivity of the antenna 13.

Fourth Embodiment

A configuration of a wireless communication module 1 according to a fourth embodiment will be now described with reference to FIG. 9, with an emphasis placed on differences from those of the first to third embodiments.

(Wireless Communication Module)

Figure 9:
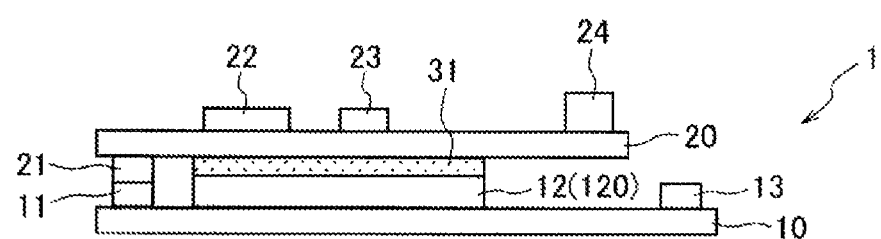
FIG. 9 is a schematic configuration view showing an example configuration of a wireless communication module according to a fourth embodiment.

FIG. 9 is a schematic configuration view showing an example configuration of the wireless communication module 1 according to the fourth embodiment. The fourth embodiment is different from the first embodiment in that the inner board side of the control board 20 (a board side of the control board 20 which faces the RF board 10) and the top of the shield plate 120 of the RF circuit 12 are fixed together by means of an adhesive 31. Material of the adhesive 31 and a method of applying the adhesive 31 are not particularly limited. For example, a double-sided tape may be used for the adhesive 31. The adhesive 31 may be made of an insulating material.

As described above, in the wireless communication module 1 according to the fourth embodiment, the inner board side of the control board 20 is fixed to the RF circuit 12 by means of the adhesive 31. This can provide a higher connection strength than the connection between the RF board 10 and the control board 20 by means of only the connectors 11 and 21.

Fifth Embodiment

A configuration of a wireless communication module 1 according to a fifth embodiment will be now described with reference to FIG. 10, with an emphasis placed on differences from those of the first to fourth embodiments.

(Wireless Communication Module)

Figure 10:
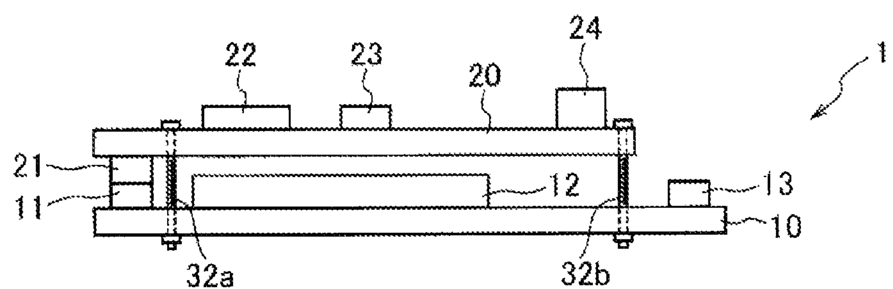
FIG. 10 is a schematic configuration view showing an example configuration of a wireless communication module according to a fifth embodiment.

FIG. 10 is a schematic configuration view showing an example configuration of the wireless communication module 1 according to the fifth embodiment. The fifth embodiment is different from the first embodiment in that the RF board 10 and the control board 20 are fixed together by means of screws 32*a* and 32*b*. The screws 32*a* and 32*b* may be positioned at any suitable places such as four corners of the control board 20.

As described above, in the wireless communication module 1 according to the fifth embodiment, the RF board 10 and the control board 20 are fixed together by means of the screws 32*a* and 32*b*. This can provide higher connection strength than connection between the RF board 10 and the control board 20 by means of only the connectors 11 and 21.

Sixth Embodiment

A configuration of a wireless communication module 1 according to a sixth embodiment will be now described with reference to FIG. 11, with an emphasis placed on differences from those of the first to fifth embodiments.

(Wireless Communication Module)

Figure 11:
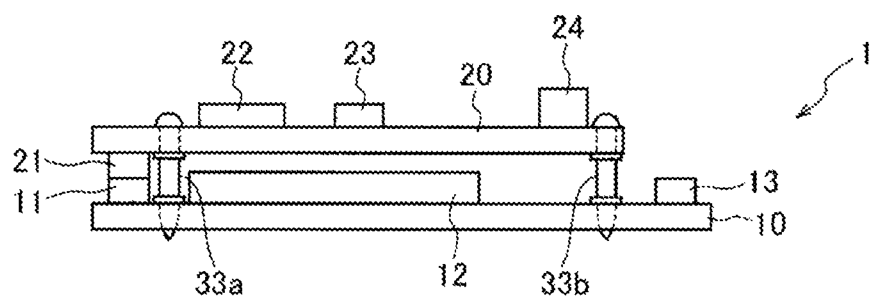
FIG. 11 is a schematic configuration view showing an example configuration of a wireless communication module according to a sixth embodiment.

FIG. 11 is a schematic configuration view showing an example configuration of the wireless communication module 1 according to the sixth embodiment. The sixth embodiment is different from the first embodiment in that the RF board 10 and the control board 20 are fixed together by means of locking supports 33*a* and 33*b*. The locking supports 33*a* and 33*b* may be positioned at any suitable place such as four corners of the control board 20.

As described above, in the wireless communication module 1 according to the sixth embodiment, the RF board 10 and the control board 20 are fixed together by means of the locking supports 33*a* and 33*b*. This can provide higher connection strength than connection between the RF board 10 and the control board 20 by means of only the connectors 11 and 21.

Seventh Embodiment

A configuration of a wireless communication module 1 according to a seventh embodiment will be now described with reference to FIG. 12, with an emphasis placed on differences from those of the first to sixth embodiments.

(Wireless Communication Module)

Figure 12:
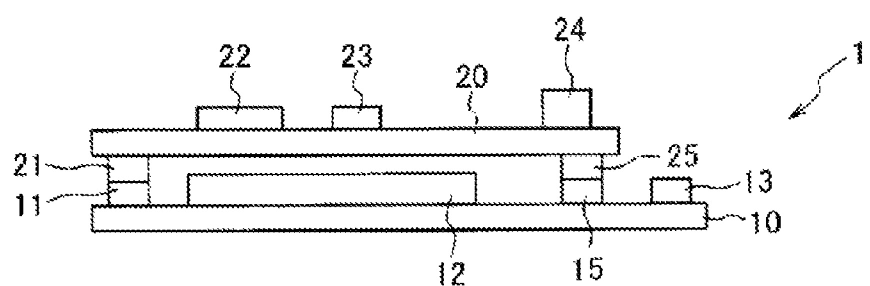
FIG. 12 is a schematic configuration view showing an example configuration of a wireless communication module according to a seventh embodiment.

FIG. 12 is a schematic configuration view showing an example configuration of the wireless communication module 1 according to the seventh embodiment. The seventh embodiment is different from the first embodiment in that two pairs of inter-board connectors are provided at two separate places, respectively. Specifically, in addition to the connector 11 provided in the left end of the RF board 10, a connector 15 is provided in the right end of the RF board 10. Further, in addition to the connector 21 provided in the left end of the control board 20, a connector 25 is provided in the right end of the control board 20.

As described above, in the wireless communication module 1 according to the seventh embodiment, the two pairs of inter-board connectors are provided at the two separate places, respectively. This can provide higher connection strength than the connection between the RF board 10 and the control board 20 by means of only the connectors 11 and 21.

Eighth Embodiment

A configuration of a wireless communication module 1 according to an eighth embodiment will be now described with reference to FIGS. 13A to 14D, with an emphasis placed on differences from those of the first to seventh embodiments.

(Wireless Communication Module)

Figure 13A:
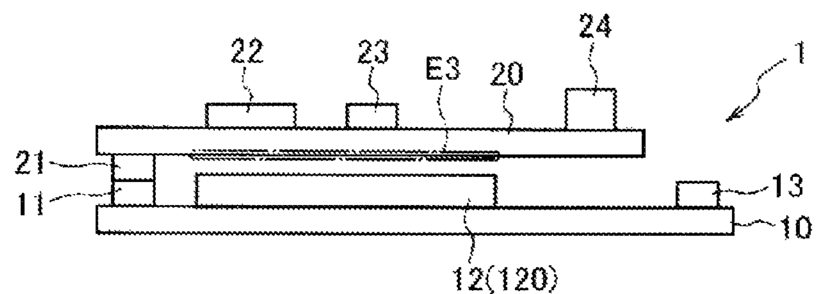
FIGS. 13A and 13B are schematic configuration views showing an example configuration of the wireless communication module according to the first embodiment, FIG. 13A being a schematic side view and FIG. 13B being a schematic plan view showing an inner board side of a control board.
Figure 13B:
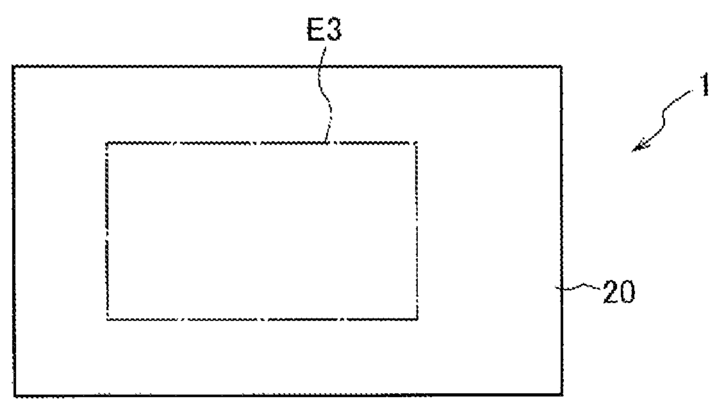

With the first embodiment, there is a possibility of contact of the inner board side of the control board 20 with the top of the shield plate 120 of the RF circuit 12. Specifically, as shown in FIGS. 13A and 13B, since some gap is present between the control board 20 and the RF circuit 12, there is a possibility of contact to a region E3 on the inner board side of the control board 20, which faces the RF circuit 12, with the RF circuit 12 under application of a load to the wireless communication module 1. For this reason, wiring patterns to be formed on the inner board side of the control board 20 need to be arranged outside the region E3.

Figure 14A:
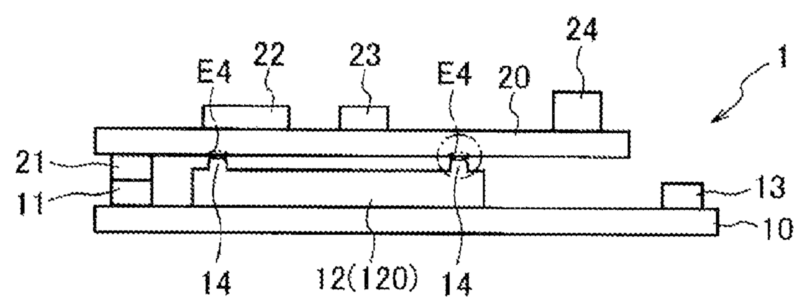
FIGS. 14A to 14D are schematic configuration views showing an example configuration of a wireless communication module according to an eighth embodiment, FIG. 14A being a schematic side view, FIG. 14B being a schematic plan view showing an inner board side of a control board, FIG. 14C being a schematic enlarged sectional view and FIG. 14D being another schematic enlarged sectional view.
Figure 14B:
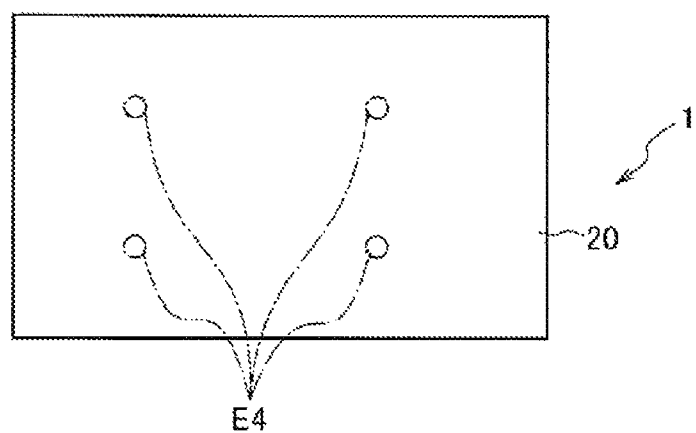
Figure 14C:
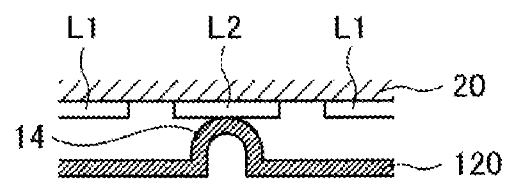
Figure 14D:
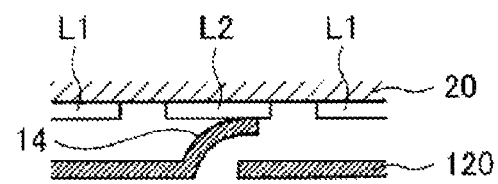

FIGS. 14A and 14B are schematic configuration views showing an example configuration of the wireless communication module 1 according to the eighth embodiment, FIG. 14A being a schematic side view and FIG. 14B being a schematic plan view showing the inner board side of the control board 20. FIGS. 14C and 14D are schematic enlarged sectional views of a dot-circled portion in FIG. 14A. As shown in these figures, projections 14 projecting toward the control board 20 are respectively formed in four corners of the top of the shield plate 120 covering the RF circuit 12, which faces the control board 20. This prevents the shield plate 120 from contacting the control board 20 except the projections 14. Accordingly, as shown in FIG. 14C, signal wiring patterns L1 can be formed on the inner board side of the control board 20 in regions except the projections 14 (i.e., regions other than regions E4). However, ground wiring patterns L2 are, for example, formed in the regions E4 contacting the projections 14. Thus, the shield plate 120 can serve as a ground.

The projections 14 may be formed of an elastically deformable spring which can be integrated with the shield plate 120 as shown in FIG. 14D. The RF board 10 and the control board 20 are interconnected and fixed together with the projections 14 being bent. That is, when the RF board 10 and the control board 20 are interconnected, the projections 14 make contact with the control board 20 under a condition where the projections 14 are bent. This ensures reliable contact of the ground wiring patterns L2 of the control board 20 with the shield plate 120, for example even if the height of the projections 14 is uneven. In this case, since the control board 20 is pressed upward by the projections 14, the spring connector 11 and 21 and so on may be under load. Accordingly, for example, the RF board 10 and the control board 20 may be interconnected and fixed together at multiple sites.

As described above, the wireless communication module 1 according to the eighth embodiment is provided with the projections 14 formed in the four corners of the top of the shield plate 120, which faces the control board 20. This prevents the shield plate 120 from contacting the control board 20 except the projections 14, thereby providing an extended region on the inner board side of the control board 20 in which the signal wiring patterns L1 can be formed.

In addition, the ground wiring patterns L2 are formed in the regions contacting the projections 14. This allows the shield plate 120 to serve as a ground, which may result in an increased ground area contributing to circuit stability. In addition, the projections 14 and the ground wiring patterns L2 (or pads) of the control board 20 may be fixed together by means of a conductive adhesive.

Ninth Embodiment

A configuration of a wireless communication module 1 according to a ninth embodiment will be now described with reference to FIGS. 15A and 15B, with an emphasis placed on differences from those of the first to eighth embodiments.

(Wireless Communication Module)

Figure 15A:
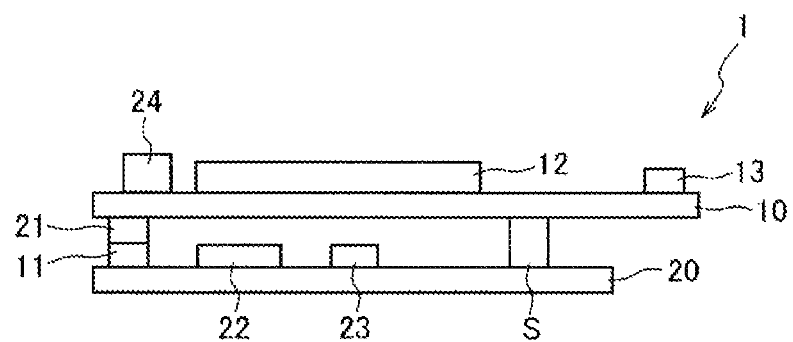
FIGS. 15A and 15B are schematic configuration views showing an example configuration of a wireless communication module according to a ninth embodiment.
Figure 15B:
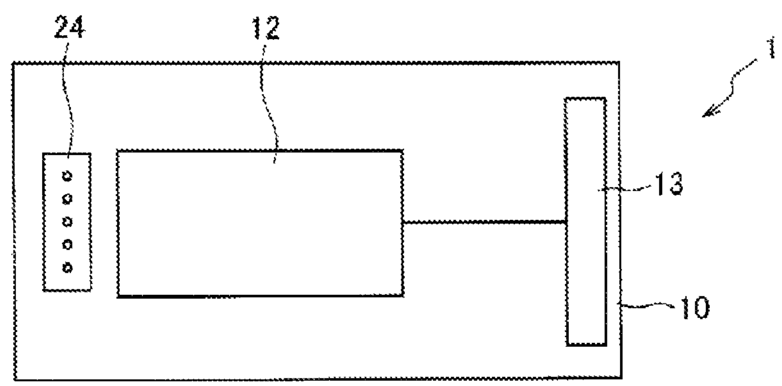

FIGS. 15A and 15B are schematic configuration views showing an example configuration of the wireless communication module 1 according to the ninth embodiment. The ninth embodiment is different from the first embodiment in that the RF circuit 12 and the control board 20 are arranged in a reversed fashion. That is, the RF circuit 12 and the control board 20 are arranged such that a board side of the RF board 10 on which the RF circuit 12 is not mounted faces a board side of the control board 20 on which the microcomputer 22 is mounted. In this case, in order to prevent the microcomputer 22 from contacting the inner board side of the RF board 10, a spacer S is interposed between the RF board 10 and the control board 20. It is to be understood that the spacer S may be appropriately changed in its height, shape and the like.

As described above, in the wireless communication module 1 according to the ninth embodiment, the RF circuit 12 and the control board 20 are arranged such that the board side of the RF board 10 on which the RF circuit 12 is not mounted faces the board side of the control board 20 on which the microcomputer 22 is mounted. Like the first embodiment, this configuration can also provide a reduced size of the wireless communication module 1 while integrating the RF circuit 12 with the microcomputer 22 and realize a reduction in production costs. Of course, the ninth embodiment can be combined with the second to eighth embodiments.

Tenth Embodiment

A configuration of a wireless communication module 1 according to a tenth embodiment will be now described with reference to FIGS. 16A to 18C, with an emphasis placed on differences from those of the first to ninth embodiments.

(Wireless Communication Module)

Figure 16A:
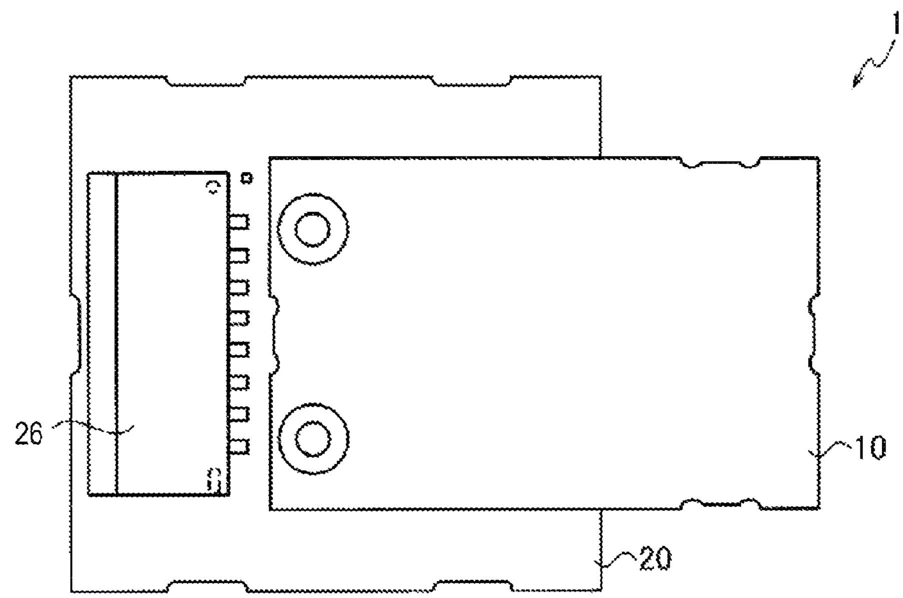
FIGS. 16A and 16B are schematic configuration views showing an example configuration of a wireless communication module according to a tenth embodiment, FIG. 16A being a schematic plan view and FIG. 16B being a schematic side view.
Figure 16B:
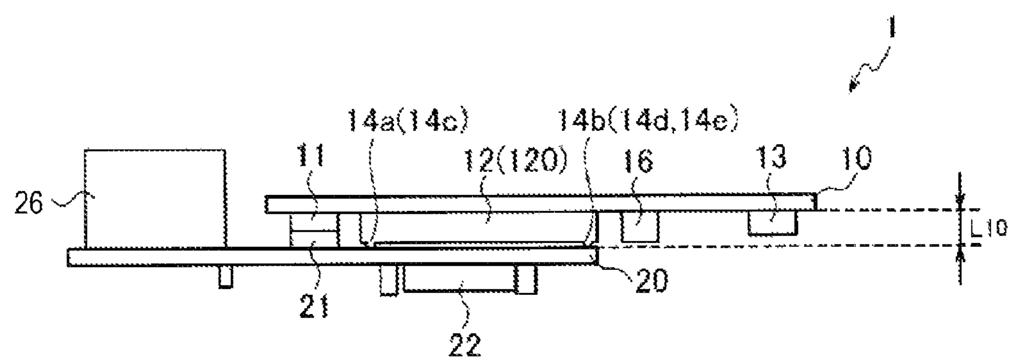

FIGS. 16A and 16B are schematic plan and side views of the wireless communication module 1 according to the tenth embodiment, respectively. As shown in FIGS. 16A and 16B, a connector 26 taller than a distance L10 between the RF board 10 and the control board 20 is disposed in a region on the control board 20 in which the RF board 10 does not overlap with the control board 20. The connector 26 is used for external connections. This configuration makes it possible to reduce the distance L10 between the RF board 10 and the control board 20, which may result in compactness of the wireless communication module 1.

When the connector 11 of the RF board 10 is connected to the connector 21 of the control board 20, the RF board 10 faces the control board 20. The RF circuit 12 is interposed between the RF board 10 and the control board 20 and the microcomputer 22 is disposed on the outer board side of the control board 20. In addition, the antenna 13, a connector 16 and so on are disposed on the inner board side of the RF board 10 which projects out beyond the right-edge of the control board 20 as shown in FIGS. 16A and 16B.

(RF Board)

Figure 17A:
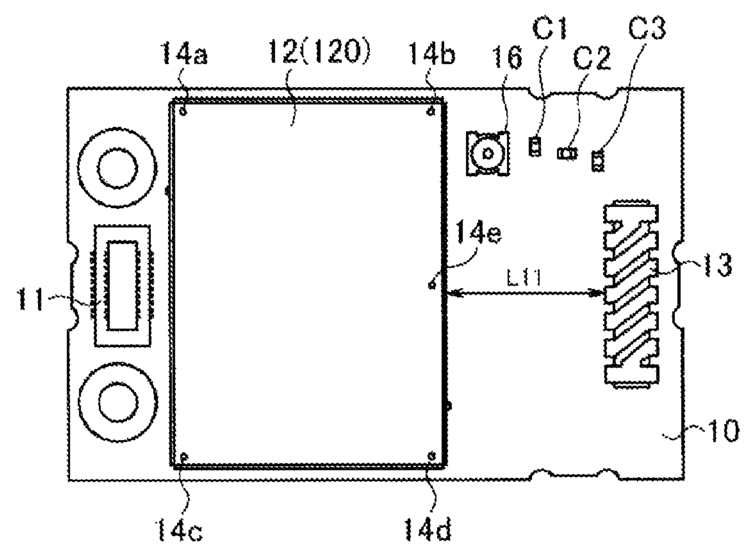
FIGS. 17A and 17B are schematic configuration views of the RF board shown in FIGS. 16A and 16B, FIG. 17A being a schematic plan view and FIG. 17B being a schematic side view.
Figure 17B:
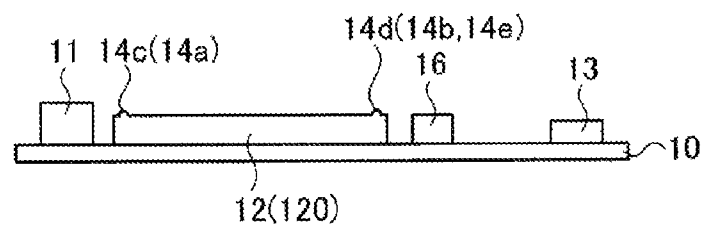

FIGS. 17A and 17B are schematic plan and side views of the RF board 10 shown in FIGS. 16A and 16B, respectively. As shown in FIGS. 17A and 17B, the RF circuit 12 is covered by the metal shield plate 120. Projections 14*a* to 14*d* are respectively formed in four corners of the top of the shield plate 120 which faces the control board 20, and a projection 14*e* is formed in a central portion of one edge of a quadrangle defined by the four corners of the shield plate 120. In addition to the projections 14*a* to 14*d* formed in the four corners, the projection 14*e* is formed in the central portion of one of its edges. This additional projection 14*e* can prevent the shield plate 120 from being mounted in a wrong direction.

In addition, as shown in FIGS. 17A and 17B, the antenna 13 may be disposed in a region on the RF board 10 in which the RF board 10 does not overlap with the control board 20. Since the shield plate 120 is electrically connected to the ground of the RF board 10, a radio wave transmitted/received by the antenna 13 may interfere with and be absorbed into the shield plate 120 if the antenna 13 becomes too close to the shield plate 120.

To avoid this problem, the shield plate 120 can be disposed at a distance L11 from the antenna 13, which is larger than ¼ of a wavelength ($\lambda$) of the radio wave transmitted/received by the antenna 13. For example, for a frequency band of 920 MHz, $\lambda/4$ is about 0.75 cm and, therefore, the distance L11 between the antenna 13 and the shield plate 120 may be set to be slightly larger than 0.75 cm (e.g., to be about 1 cm). This can prevent the radio wave transmitted/received by the antenna 13 from interfering with and being absorbed into the shield plate 120.

It is to be understood that electronic parts such the connector 16 and so on may be mounted above the antenna 13, as shown in FIG. 17A. In addition, a space for the antenna 13 may be reduced by bending the antenna 13 or attaching coils C1 to C3 externally.

(Control Board)

Figure 18A:
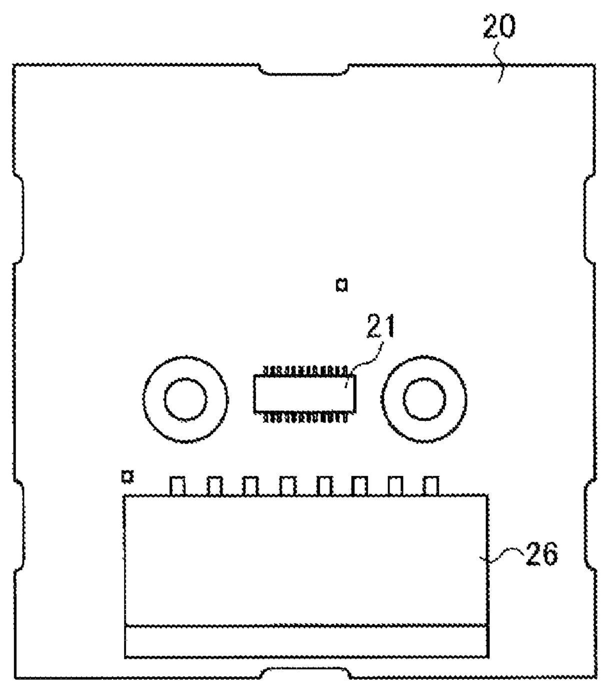
FIGS. 18A to 18C are schematic configuration views of the control board shown in FIGS. 16A and 16B, FIG. 18A being a schematic plan view, FIG. 18B being a schematic front view and FIG. 18C being a schematic side view.
Figure 18B:
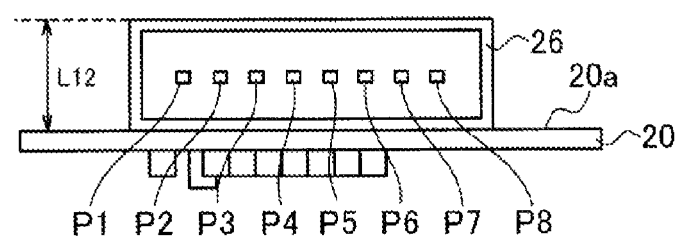
Figure 18C:
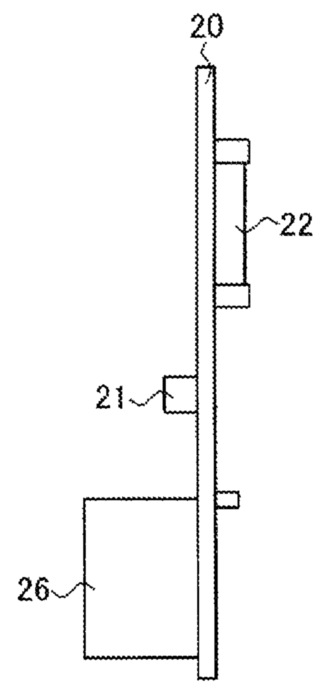

FIGS. 18A to 18C are a schematic plan, front and side views of the control board 20 shown in FIGS. 16A and 16B, respectively. As shown in FIGS. 18A to 18C, the connector 26 includes eight pins P1 to P8, i.e., a VDD pin P1, a TXD pin P2, a RXD pin P3, a RTS pin P4, a CTS pin P5, a GPIO pin P6, a GPIO pin P7 and a GND pin P8, arranged in this order. The VDD pin P1 is a power source voltage input pin, the TXD pin P2 is an asynchronous data output pin, the RXD pin P3 is an asynchronous data input pin, the RTS pin P4 is a RTS (Ready To Send) control output pin, the CTS pin P5 is a CTS (Clear To Send) control input pin, the GPIO pins P6 and P7 are user-settable input and output pins, respectively, and the GND pin P8 is a ground pin. These 8 pins P1 to P8 are arranged on the same plane in parallel to a board side 20*a* of the control board 20, as shown in FIG. 18B. This can limit the height L12 of the connector 26, thereby making the wireless communication module 1 compact. Since these input and output pins are arranged in an alternating manner, safety is guaranteed without unpredictable current flowing even if adjacent pins are circuit-shorted.

As described above, in the wireless communication module 1 according to the tenth embodiment, the connector 26 taller than the distance L10 between the RF board 10 and the control board 20 is disposed in the region on the control board 20 in which the RF board 10 does not overlap with the control board 20. This configuration makes it possible to reduce the distance L10 between the RF board 10 and the control board 20, which may result in compactness of the wireless communication module 1.

In addition, as described above, the connector 26 includes the eight pins P1 to P8, i.e., the VDD pin P1, the TXD pin P2, the RXD pin P3, the RTS pin P4, the CTS pin P5, the GPIO pin P6, the GPIO pin P7 and the GND pin P8, arranged in this order. These 8 pins P1 to P8 are arranged on the same plane in parallel to the board side 20*a* of the control board 20. This can limit the height L12 of the connector 26, thereby making the wireless communication module 1 compact.

In addition, as described above, the projections 14*a* to 14*e* are respectively formed in the four corners of the top of the shield plate 120 which faces the control board 20, and the central portion of one edge of a quadrangle defined by the four corners. This can prevent the shield plate 120 from being mounted in a wrong direction.

In addition, as described above, the shield plate 120 is disposed at a distance L11 from the antenna 13, which is larger than ¼ of the wavelength ($\lambda$) of the radio wave transmitted/received by the antenna 13. This can prevent the radio wave transmitted/received by the antenna 13 from interfering with and being absorbed into the shield plate 120, which may prevent sensitivity of the antenna 13 from being deteriorated.

As apparent from the above description, the present disclosure can provide a wireless communication module 1, an LED lighting device, a solar photovoltaic system, a self-start system and a detection device which are capable of achieving compactness while integrating the RF circuit 12 with the microcomputer 22 and realizing reduction in production costs.

Other Embodiments

While the present disclosure has been described by way of the first to tenth embodiments, it should be understood that the description and the drawings constituting a part of the present disclosure are only illustrative. It is apparent to those skilled in the art that the embodiments may be modified, altered, changed and operated in various different ways when reading from the detailed description and the drawings.

Thus, the present disclosure encompasses other different embodiments which are not described herein. For example, while it has been illustrated in FIGS. 1A to 1C and so on that the RF board 10 overlaps entirely with the control board 20, the RF board 10 may overlap at least partially with the control board 20.

INDUSTRIAL APPLICABILITY

The wireless communication module according to the present disclosure can be applied to LED lighting devices, solar photovoltaic systems, self-start systems, detection devices and other devices and systems.

The present disclosure can provide a wireless communication module, an LED lighting device, a solar photovoltaic system, a self-start system and a detection device which are capable of achieving compactness while integrating an RF circuit with a microcomputer and realizing reduction in production costs.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A wireless communication module comprising:
- a wireless circuit configured to transmit/receive a wireless signal;
- a first inter-board connector;
- a first board on which the wireless circuit and the first connector are mounted;
- a signal processing circuit configured to process the wireless signal transmitted/received by the wireless circuit;
- a second inter-board connector configured to be connected to the first connector; and
- a second board on which the signal processing circuit and the second connector are mounted,
- wherein the first board overlaps at least partially with the second board under a condition where the first connector and the second connector are interconnected, and
- wherein the first board and the second board are arranged such that a board side of the first board on which the wireless circuit is mounted faces a board side of the second board on which the signal processing circuit is not mounted.

2. The wireless communication module of claim 1, wherein an antenna is disposed in a region on the first board where the first board and the second board do not overlap with each other.

3. A wireless communication module comprising:
- a wireless circuit configured to transmit/receive a wireless signal;
- a first inter-board connector;
- a first board on which the wireless circuit and the first connector are mounted;
- a signal processing circuit configured to process the wireless signal transmitted/received by the wireless circuit;
- a second inter-board connector configured to be connected to the first connector; and
- a second board on which the signal processing circuit and the second connector are mounted,
- wherein the first board overlaps at least partially with the second board under a condition where the first connector and the second connector are interconnected, and
- wherein the wireless circuit is covered by a metal shield plate.

4. The wireless communication module of claim 3, wherein a projection is formed at a predetermined position of a top of the shield plate which faces the second board.

5. The wireless communication module of claim 4, wherein a signal wiring pattern is formed in a region avoiding the projection on the board side of the second board which faces the first board.

6. The wireless communication module of claim 4, wherein a ground wiring pattern is formed in a region contacting the projection on the board side of the second board which faces the first board.

7. The wireless communication module of claim 4, wherein the projection is an elastically deformable spring, and the projection contacts the second board, with the projection being bent, when the first connector and the second connector are interconnected.

8. A wireless communication module comprising:
- a wireless circuit configured to transmit/receive a wireless signal;
- a first inter-board connector;
- a first board on which the wireless circuit and the first connector are mounted;
- a signal processing circuit configured to process the wireless signal transmitted/received by the wireless circuit;
- a second inter-board connector configured to be connected to the first connector; and
- a second board on which the signal processing circuit and the second connector are mounted,
- wherein the first board overlaps at least partially with the second board under a condition where the first connector and the second connector are interconnected, and
- wherein the first board has a higher dielectric constant than that of the second board.

9. A wireless communication module comprising:
- a wireless circuit configured to transmit/receive a wireless signal;
- a first inter-board connector;
- a first board on which the wireless circuit and the first connector are mounted;
- a signal processing circuit configured to process the wireless signal transmitted/received by the wireless circuit;
- a second inter-board connector configured to be connected to the first connector; and
- a second board on which the signal processing circuit and the second connector are mounted,
- wherein the first board overlaps at least partially with the second board under a condition where the first connector and the second connector are interconnected, and
- wherein a fourth connector taller than a distance between the first board and the second board is disposed in a region on the second board where the first board and the second board do not overlap with each other.

10. The wireless communication module of claim 9, wherein the fourth connector has eight pins including a VDD pin, a TXD pin, a RXD pin, a RTS pin, a CTS pin, a GPIO pin, another GPIO pin and a GND pin, arranged in this order.

11. The wireless communication module of claim 10, wherein the eight pins are arranged on the same plane in parallel to a board side of the second board.

12. The wireless communication module of claim 9, wherein the wireless circuit is covered by a metal shield plate, and projections are respectively formed in four corners of a top of the shield plate which faces the second board and a central portion of one edge of a quadrangle defined by the four corners.

13. The wireless communication module of claim 12, wherein an antenna is disposed in a region on the first board where the first board and the second board do not overlap with each other, and the shield plate is disposed at a distance from the antenna, the distance being larger than ¼ of a wavelength of a radio wave transmitted/received by the antenna.

14. A solar photovoltaic system comprising a wireless communication module of claim 1.

* * * * *